(12) United States Patent
Hosotani et al.

(10) Patent No.: US 6,333,538 B1
(45) Date of Patent: *Dec. 25, 2001

(54) COB DRAM HAVING CONTACT EXTENDING OVER ELEMENT-ISOLATING FILM

(75) Inventors: Keiji Hosotani, Yokohama; Yusuke Kohyama, Yokosuka, both of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/388,937

(22) Filed: Sep. 2, 1999

Related U.S. Application Data

(63) Continuation of application No. 08/684,059, filed on Jul. 19, 1996, now Pat. No. 5,977,583.

(30) Foreign Application Priority Data

Jul. 21, 1995 (JP) .................................................... 7-185257
Oct. 11, 1995 (JP) .................................................... 7-262633

(51) Int. Cl.[7] .................................................. H01L 27/108
(52) U.S. Cl. ............................................. 257/311; 257/306
(58) Field of Search .................................. 257/311, 296, 257/298, 300, 306, 368, 93, 374, 503, 506, 307–313, 752

(56) References Cited

U.S. PATENT DOCUMENTS

| | | | |
|---|---|---|---|
| 4,649,412 | 3/1987 | Iwase et al. | 257/382 |
| 5,144,579 | * 9/1992 | Okabe et al. | 365/149 |
| 5,235,199 | 8/1993 | Hamamoto et al. | 257/308 |
| 5,248,628 | 9/1993 | Okabe et al. | 437/47 |
| 5,392,189 | 2/1995 | Fazen et al. | 257/306 |
| 5,434,439 | 7/1995 | Ajika et al. | 257/307 |
| 5,459,345 | 10/1995 | Okudaira et al. | 257/310 |
| 5,459,346 | 10/1995 | Asakawa et al. | 257/774 |
| 5,486,712 | 1/1996 | Arima | 257/309 |
| 5,519,237 | 5/1996 | Itoh et al. | 257/308 |
| 5,541,428 | 7/1996 | Nagatomo | 257/307 |
| 5,663,585 | 9/1997 | Lee et al. | 257/296 |

FOREIGN PATENT DOCUMENTS 6-120423    4/1994   (JP) .

* cited by examiner

*Primary Examiner*—Jerome Jackson, Jr.
*Assistant Examiner*—Bradley Wm. Baumeister

(57) ABSTRACT

In a method of fabricating a COB DRAM cell, a polysilicon plug is formed on the source and drain in self-alignment with the gate electrode. A bit line contact and a storage electrode contact are formed on the polysilicon plug thereby to reduce the aspect ratio of both the bit line contact and the storage electrode contact. With the polysilicon plug formed in self-alignment with the gate electrode, short-circuiting of contacts of adjacent element regions and short-circuiting of the plugs of the source and drain will not occur, leading to high protection against misregistration. Moreover, an independent lithography process is not required for forming the polysilicon plug, and, therefore, the number of fabrication steps is reduced.

43 Claims, 12 Drawing Sheets

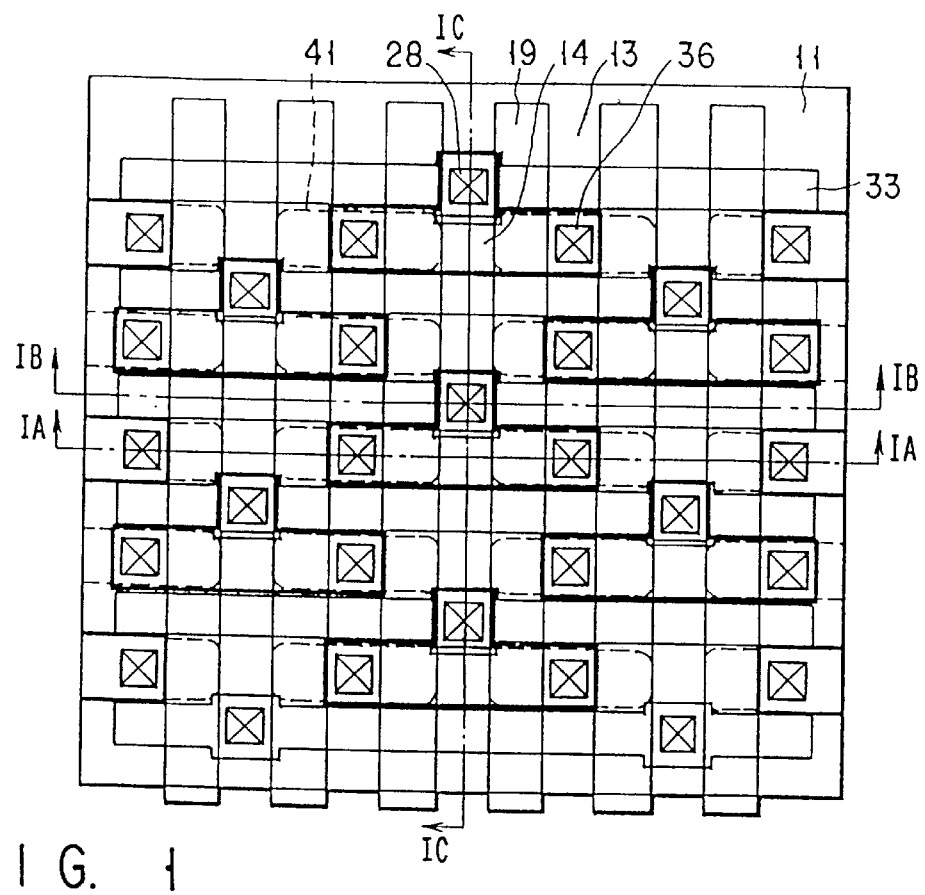
F I G. 1
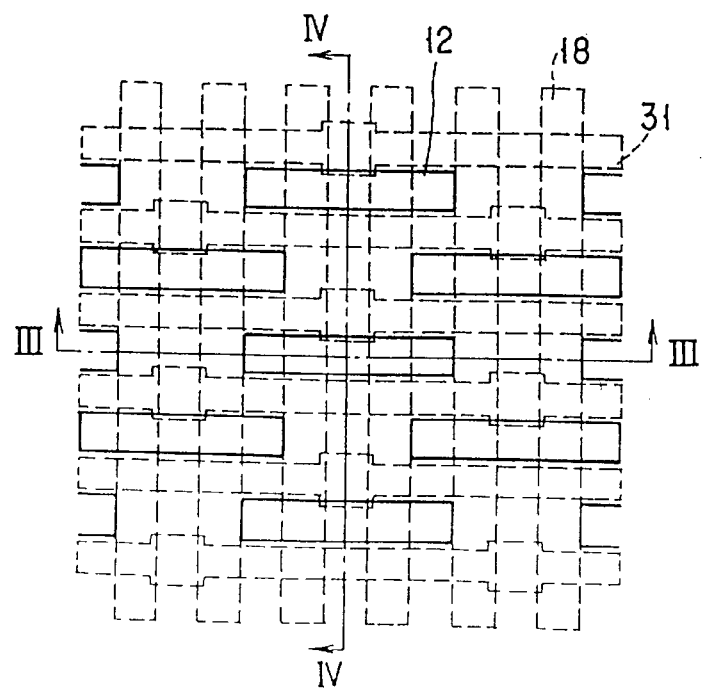
F I G. 2

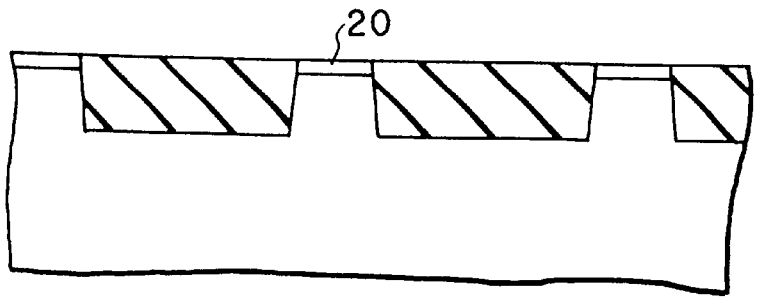
F I G. 7
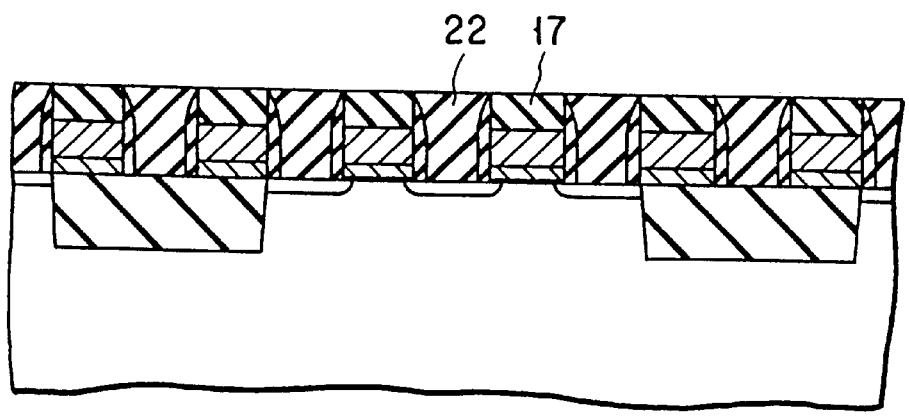
F I G. 8
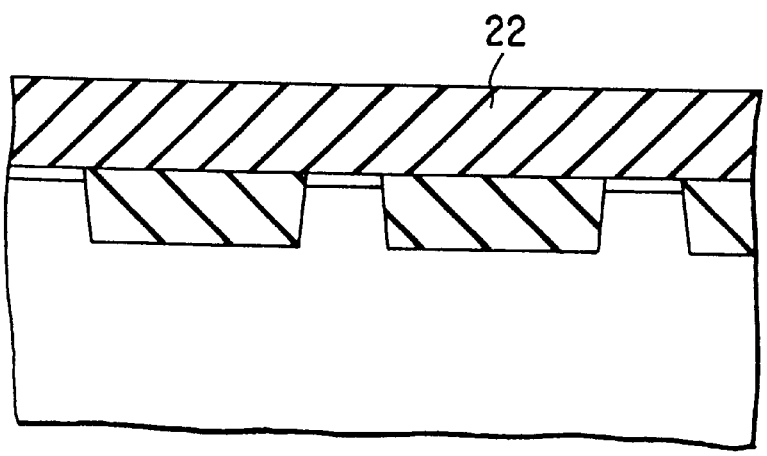
F I G. 9

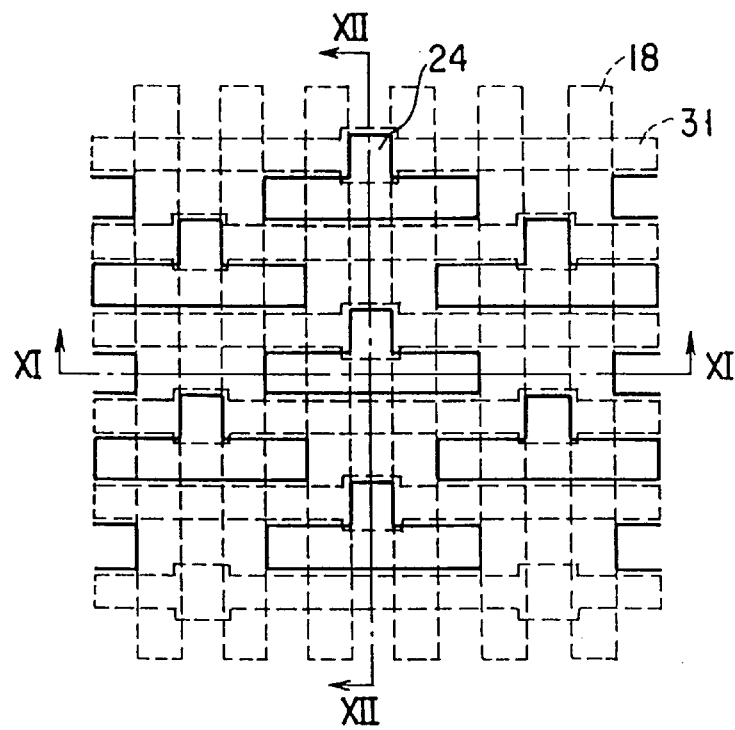
F I G. 10
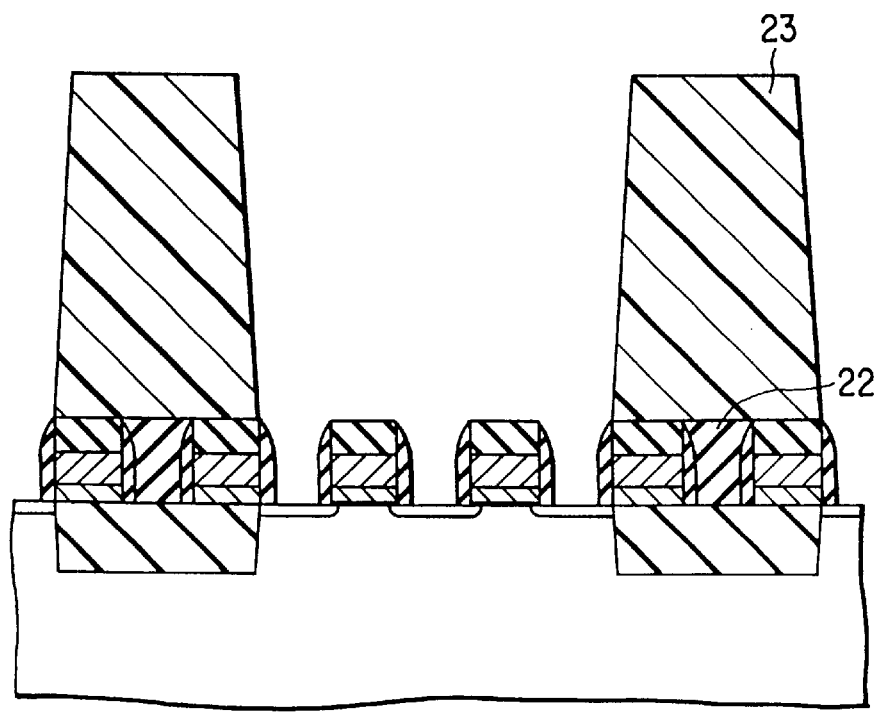
F I G. 11

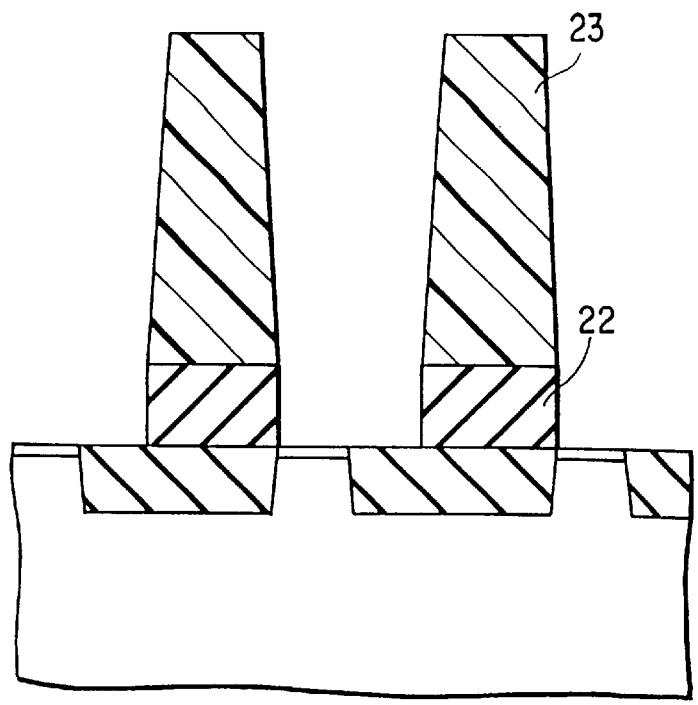
F I G. 12
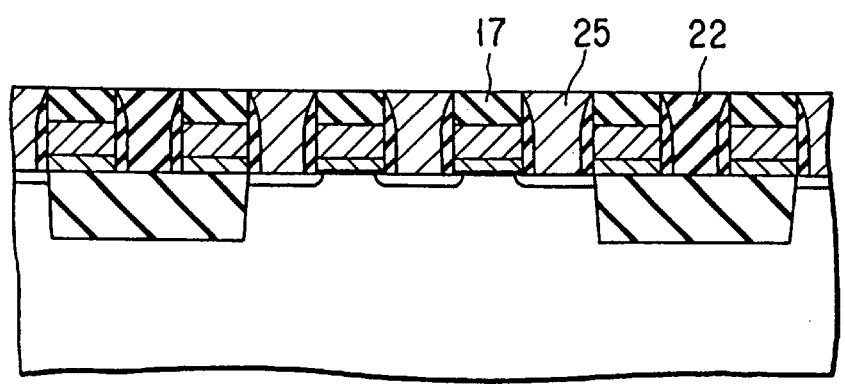
F I G. 13
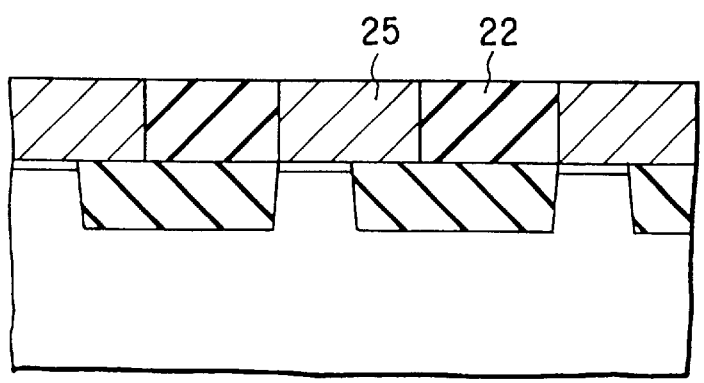
F I G. 14

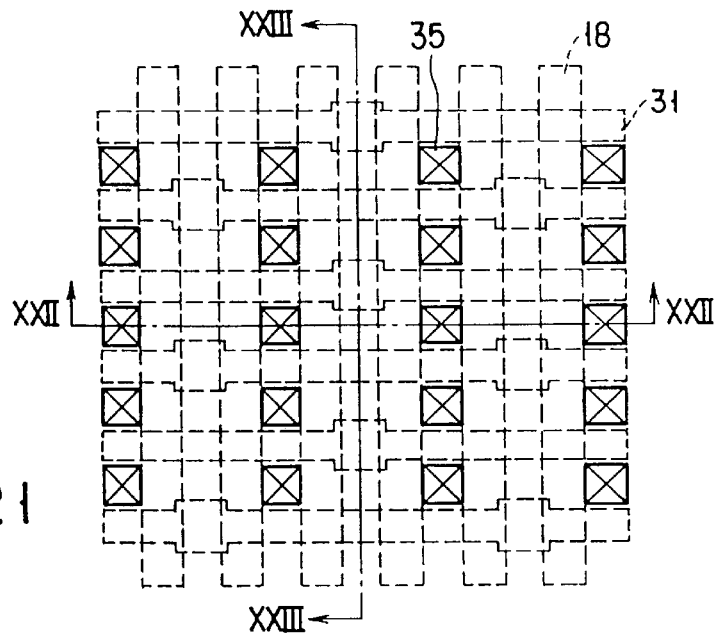
F I G. 21
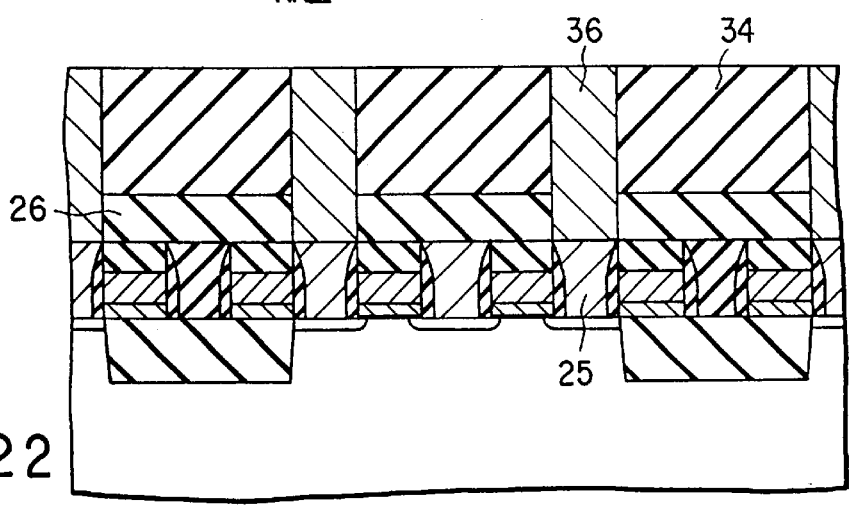
F I G. 22
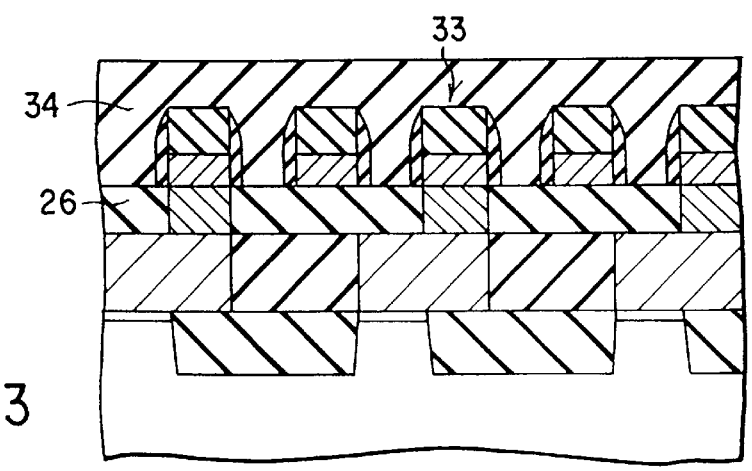
F I G. 23

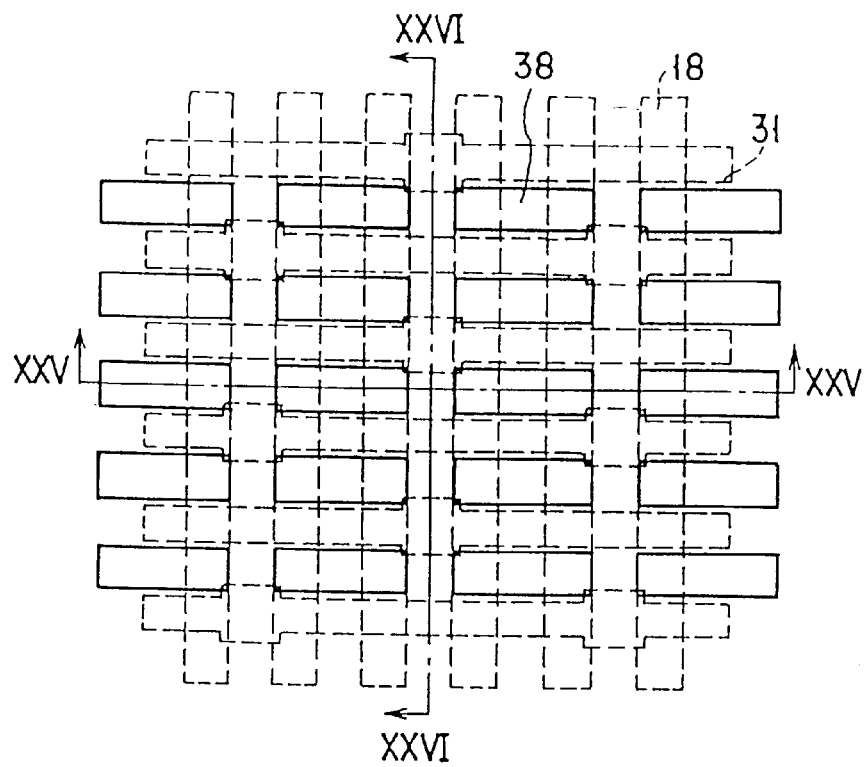
F I G. 24
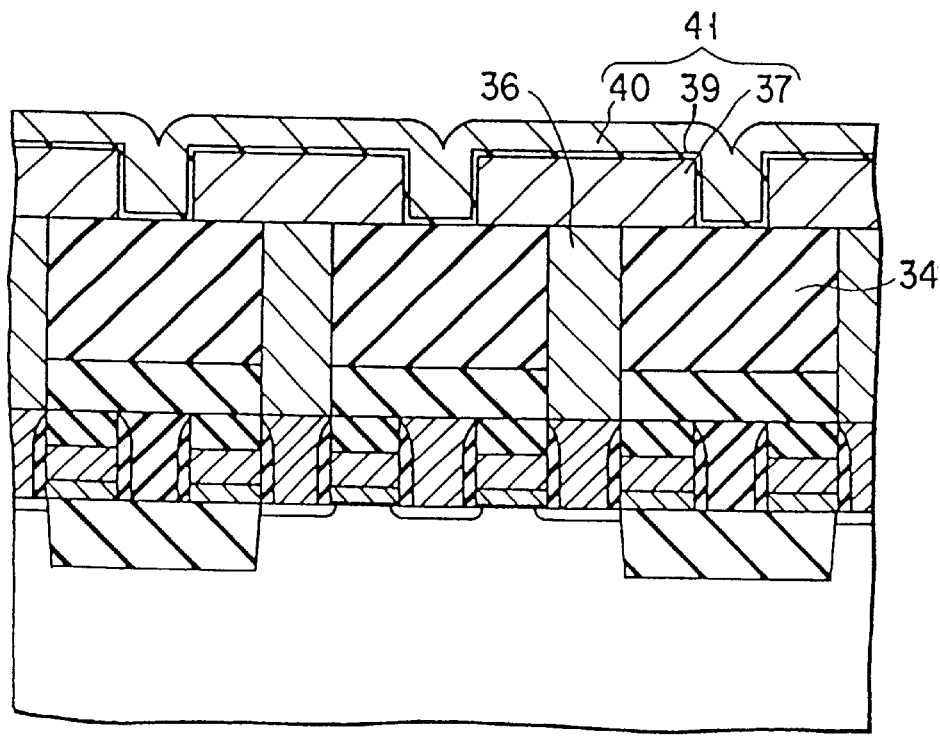
F I G. 25

COB DRAM HAVING CONTACT EXTENDING OVER ELEMENT-ISOLATING FILM

This application is a continuation of prior application Ser. No. 08/684,059 filed Jul. 19, 1996, now U.S. Pat. No. 5,977,583.

BACKGROUND OF THE INVENTION

1. Field of the Invention

The present invention relates to a structure and a method of fabricating a DRAM cell, or more in particular to a method of fabricating a memory cell of capacitor on bit-line type (COB) in which at least a bit line is formed first, and then at least a memory capacitor is formed on the bit line.

2. Description of the Related Art

The integration scale of semiconductor memory devices, especially, that of the dynamic RAM is ever on the increase every year. The resulting tendency is toward a further reduced area occupied by a unit memory element. A three-dimensional cell structure is therefore essential for securing a memory cell capacity sufficient for read and write operations (more than 20 fF). This has promoted general applications of cell structures using a trench-type capacitor and a stack-type capacitor.

A conventional method of fabricating a stack-type capacitor concerns a COB (capacitor over bit-line) memory cell as disclosed in, for example, "A CAPACITOR-OVER-BIT-LINE (COB) CELL WITH A HEMISPHERICAL-GRAIN STORAGE NODE FOR 64 Mb DRAMs', by M. Sakao et al., IEDM Technical Digest, pp.655–658, 1990.

This device will be described in detail below with reference to drawings.

FIG. 27 is a plan view showing a COB memory cell, FIG. 28 a perspective view taken diagonally from above the memory cell of FIG. 27, FIGS. 29, 30, 32 sectional views taken in line XXIX—XXIX in FIG. 27, showing semiconductor structures in the fabrication steps of the COB memory cell, and FIG. 31 a sectional view taken in line XXXI—XXXI in FIG. 27, showing a semiconductor structure in the fabrication step of the COB memory cell.

As shown in FIG. 29, first, an element-isolating oxide film 13 is formed on a silicon substrate 11 using the LOCOS process, while at the same time forming at least an element region 14. Next, a gate oxide film (not shown) is formed. Polysilicon gate electrodes 19 each having the upper surface and the sidewalls thereof covered with a silicon oxide film are formed on the gate oxide film. Contact holes are opened to the gate electrodes 19 in self-alignment on the element region 14, and a polysilicon film is deposited to form interconnects 50 (FIG. 29).

As shown in FIG. 30, a first interlayer insulating film 51 is deposited over the whole surface. The first interlayer insulating film 51 is patterned using a bit line contact pattern 52 thereby to form a bit line contact hole 53. Polysilicon 54 with impurities introduced therein is filled in the bit line contact hole 53. Then, a bit line 55 is formed using a tungsten polycide (FIG. 30).

As shown in FIG. 31, a second interlayer insulating film 56 is deposited over the whole surface of the bit line 55 and flattened. At least a storage node contact hole 57 is opened, thereby forming HSG (hemispherical grain) storage nodes 58 connecting to the interconnects 50 (FIG. 31).

As shown in FIG. 32, a capacitor insulating film (not shown) made of a silicon oxide thin film and a silicon nitride thin film is formed over the whole surface, followed by forming plate electrodes 59 by depositing polysilicon. Then, a third interlayer insulating film 60 is deposited on the whole surface thereby to form metal wires 61 (FIG. 32).

The DRAM memory cell fabricated using the prior art has the following problems:

(1) The interconnects 50 are inserted under the bit line 55, so that the height of the bit line contact 52 is increased, resulting in an increased aspect ratio.

(2) The bit line contact 52 extends from the bit line to a diffusion layer, and therefore the aspect ratio of the bit line contact increases.

(3) The interconnects 50 are formed in the vicinity of the bit line contact 62 of an adjacent element region. Therefore, the interconnects 50 are liable to short with the polysilicon 54 in the bit line contact by misregistration.

(4) Since the bit line contact 52 is not formed in self-alignment with respect to the gate electrodes 19, a short is liable to occur between the bit line and the gate electrodes.

(5) A new lithography process is required for forming the interconnects 50, leading to an increased number of fabrication steps.

SUMMARY OF THE INVENTION

In view of the above-mentioned problems of the prior art, it is an object of the present invention to provide a memory cell structure and a method of fabricating a memory cell, in which the aspect ratio of the capacitor contact and the bit line contact can be reduced in forming a COB DRAM cell, misregistration has a lesser effect and the number of fabrication steps is not unduly increased.

According to the present invention, there is provided a semiconductor memory device comprising: a semiconductor substrate; an element-isolating oxide film formed on the semiconductor substrate for defining an element region; a first interlayer insulating film formed on the element region and the element-isolating oxide film; a first contact hole formed in the first interlayer insulating film and extending over the element region and the element-isolating oxide film, the first contact hole reaching the semiconductor substrate; and a first conductive film connected to the element region for filling the first contact hole.

The semiconductor memory device may further comprise: a second interlayer insulating film formed on the first interlayer insulating film and the first conductive film; a second contact hole formed in the second interlayer insulating film and reaching the first conductive film above the element-isolating oxide film; and a wiring layer connected to the first conductive film through the second contact hole.

The semiconductor memory device may further comprise: a third contact hole formed in the first interlayer insulating film and reaching the semiconductor substrate at the element region; and a second semiconductive film filling the third contact hole.

The semiconductor memory device may further comprise a gate insulating film formed on the element region between the first contact hole and the third contact hole and a gate electrode extending over the gate insulating film.

The semiconductor memory device may further comprise: a third interlayer insulating film formed on the second interlayer insulating film and the wiring layer; a fourth contact hole formed through the third interlayer insulating film and the second interlayer insulating film and reaching the second conductive film; and a first electrode formed on the third interlayer insulating film and connected with the second conductive film through the fourth contact hole.

The semiconductor memory device may further comprise: a capacitor insulating film formed on the first electrode; and a second electrode formed on the capacitor insulating film.

According to the present invention, there is further provided a semiconductor memory device comprising: a semiconductor substrate; an element-isolating oxide film formed on the semiconductor substrate for defining an element region; a data transfer MOSFET formed on the element region and having a gate electrode thereof connected to a word line; a first interlayer insulating film covering the element-isolating oxide film and the MOSFET; a first contact hole formed in the first interlayer insulating film and extending over the element region and the element-isolating oxide film, the first contact hole reaching one of the source/drain diffusion layers of the MOSFET; a second contact hole formed in the first interlayer insulating film and reaching the other of the source/drain diffusion layers of the MOSFET on the element region; a first conductive plug filling the first contact hole; a second conductive plug filling the second contact hole; a second interlayer insulating film covering the first interlayer insulating film, the first conductive plug and the second conductive plug; a bit line contact hole formed in the second interlayer insulating film and reaching the first conductive plug above the element-isolating oxide film; a third conductive plug filling the bit line contact hole; a bit line formed on the second interlayer insulating film and the third conductive plug; a third interlayer insulating film formed on the second interlayer insulating film and the bit line; a storage node contact formed through the third interlayer insulating film and the second interlayer insulating film, and reaching the second conductive plug; and a storage node electrode, a capacitor insulating film and a plate electrode sequentially formed on the third interlayer insulating film and the storage node contact.

According to the present invention, there is still further provided a method of fabricating a semiconductor memory device, comprising the steps of: forming an element-isolating oxide film for defining an element region on a semiconductor substrate; forming a first interlayer insulating film on the element region and the element-isolating oxide film; forming a first contact hole in the first interlayer insulating film, the first contact hole extending over the element region and the element-isolating oxide film and reaching the semiconductor substrate; and filling the first conductive film in the first contact hole.

The method of fabricating a semiconductor memory device may further comprise the steps of: forming a second interlayer insulating film on the first interlayer insulating film and the first conductive film; forming a second contact hole in the second interlayer insulating film, the second contact hole reaching the first conductive film above the element-isolating oxide film; and forming a wiring layer on the second interlayer insulating film, the wiring layer being connected to the first conductive film through the second contact hole.

The method of fabricating a semiconductor memory device may further comprise the steps of: forming a third contact hole in the first interlayer insulating film at the same time of forming the first contact hole, the third contact hole reaching the semiconductor substrate on the element region; and filling the second conductive film in the third contact hole at the same time of filling the first conductive film in the first contact hole.

The method of fabricating a semiconductor memory device may further comprise the steps of: forming a gate-insulating film on the element region between the first contact hole and the third contact hole; and forming a gate electrode extending on the gate-insulating film and the element-isolating oxide film; wherein the first contact hole and the third contact hole are formed in self-alignment with respect to the gate electrode.

The method of fabricating a semiconductor memory device may further comprise the steps of: forming a third interlayer insulating film on the second interlayer insulating film and the wiring layer; forming a third contact hole in self-alignment with respect to the wiring layer, the third contact hole reaching the second conductive film through the third interlayer insulating film and the second interlayer insulating film; and forming a first electrode connected to second conductive film through the third contact hole on the third interlayer insulating film.

The method of fabricating a semiconductor memory device may further comprise the steps of: forming a capacitor insulating film on the first electrode; and forming a second electrode on the capacitor insulating film.

According to the present invention, there is yet further provided a method of fabricating a semiconductor memory device, comprising the steps of: forming an element-isolating oxide film on a semiconductor substrate; forming a data transfer MOSFET having a gate electrode connected to a word line on an element region defined by the element-isolating oxide film; forming a first interlayer insulating film on the MOSFET and the element-isolating oxide film; forming a first contact hole and a second contact hole simultaneously in the first interlayer insulating film, the first contact hole extending on the element region and the element-isolating oxide film and reaching one of the source/drain diffusion layers of the MOSFET, the second contact hole reaching the other of the source/drain diffusion layers of the MOSFET on the element region; forming a first conductive plug filling the first contact hole; forming a second conductive plug filling the second contact hole; forming a second interlayer insulating film on the first interlayered insulating film, the first conductive plug and the second conductive plug; forming a bit line contact hole in the second interlayer insulating film, the bit line contact hole reaching the first conductive plug above the element-isolating oxide film; forming a third conductive plug filling the bit line contact hole; forming a bit line on the second interlayer insulating film and the third conductive plug; forming a third interlayer insulating film on the second interlayer insulating film and the bit line; forming a storage node contact hole reaching the second conductive plug through the third interlayer insulating film and the second interlayer insulating film; and forming a storage node contact having a storage node electrode, a capacitor insulating film and a plate electrode sequentially on the third interlayer insulating film and the storage node contact hole, thereby forming a capacitor.

In the method of fabricating a semiconductor memory device, the step of forming the first conductive plug and the second conductive plug may include the substeps of depositing a conductive film over the whole surface of the semiconductor substrate and etching the conductive film by a chemical mechanical polishing process.

The method of fabricating a semiconductor memory device may further comprise the step of forming an insulating film on the upper surface and the sidewalls of the gate electrode, the insulating film acting as a stopper against the chemical mechanical polishing process when the conductive film is etched by the chemical mechanical polishing process.

According to the present invention, there is further provided a semiconductor memory device comprising: a semiconductor substrate; an element-isolating insulating film formed on the surface of the semiconductor substrate for defining an element region; a MOS transistor formed in the element region; a first interlayer insulating film formed on the MOS transistor; a first plug formed over one of the source and drain regions of the MOS transistor and the element-isolating insulating film, the first plug being opened to the first interlayer insulating film; a second plug formed by the same layer as the first plug over the other of the source and drain regions of the MOS transistor, the second plug being opened to the first interlayer insulating film; a bit line formed on the first interlayer insulating film and connected to the first plug; a second interlayer insulating film formed on the bit line and the first interlayer insulating film; and a capacitive element formed on the second interlayer insulating film and connected to the second plug through the opening formed in the second interlayer insulating film.

In the semiconductor memory device, the semiconductor substrate and the first conductive plug may be in contact with each other by way of a surface and the sides of the semiconductor substrate.

In the semiconductor memory device, the third conductive plug and the first conductive plug may be in contact with each other by way of the upper surface and the sides of the first conductive plug.

In the semiconductor memory device, the length of the first conductive plug along the gate electrode is substantially the same as the length of the element region a long the gate electrode.

In the semiconductor memory device, the first conductive plug extends to a position deeper than the surface of the semiconductor substrate on an element-isolating region only in the vicinity of the boundary between the element-isolating region and the element region.

The use of this invention with a COB DRAM cell permits a self-aligned polysilicon plug to be formed on the source and drain. A bit line contact and a storage electrode contact are formed on this polysilicon plug thereby to reduce the aspect ratio of both the bit line contact and the storage electrode contact.

Further, a polysilicon plug according to this invention is formed in self-alignment with respect to a gate electrode. The shorting with a contact on an adjacent element region or between the plugs of the source and drain never occur. This polysilicon plug, therefore, is considered highly protective against misregistration.

Furthermore, an independent lithography process is not required for forming a polysilicon plug according to the invention, and therefore the number of fabrication steps is reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a plan view showing a semiconductor memory device according to an embodiment of the present invention;

FIG. 2 is a plan view showing an element region pattern used to fabricate the semiconductor memory device shown in FIG. 1;

FIG. 7 is a sectional view of the semiconductor structure in a step of the process of fabrication according to the embodiment of the present invention, taken in line VII—VII in FIG. 5;

FIG. 8 is a sectional view of the semiconductor structure in another step of the process of fabrication according to the embodiment of the present invention, taken in line VI—VI in FIG. 5;

FIG. 9 is a sectional view of the semiconductor structure in another step of the process of fabrication according to the embodiment of the present invention, taken in line VII—VII in FIG. 5;

FIG. 10 is a plan view showing a plug pattern used to fabricate the semiconductor memory device shown in FIG. 1;

FIG. 11 is a sectional view of the semiconductor structure in a step of the process of fabrication according to the embodiment of the present invention, taken in line XI—XI in FIG. 10;

FIG. 12 is a sectional view of the semiconductor structure in a step of the process of fabrication according to the embodiment of the present invention, taken in line XII—XII in FIG. 10;

FIG. 13 is a sectional view of the semiconductor structure in another step of the process of fabrication according to the embodiment of the present invention, taken in line XI—XI in FIG. 10;

FIG. 14 is a sectional view of the semiconductor structure in another step of the process of fabrication according to the embodiment of the present invention, taken in line XII—XII in FIG. 10;

FIG. 21 is a plan view showing a storage node contact pattern used to fabricate the semiconductor memory device shown in FIG. 1;

FIG. 22 is a sectional view of the semiconductor structure in a step of the process of fabrication according to the embodiment of the present invention, taken in line XXII—XXII in FIG. 21;

FIG. 23 is a sectional view of the semiconductor structure in a step of the process of fabrication according to the embodiment of the present invention, taken in line XXIII—XXIII in FIG. 21;

FIG. 24 is a plan view showing a storage node pattern used to fabricate the semiconductor memory device shown in FIG. 1;

FIG. 25 is a sectional view of the semiconductor structure in a step of the process of fabrication according to the embodiment of the present invention, taken in line XXV—XXV in FIG. 24;

DETAILED DESCRIPTION OF THE PREFERRED EMBODIMENTS

Figure 3:
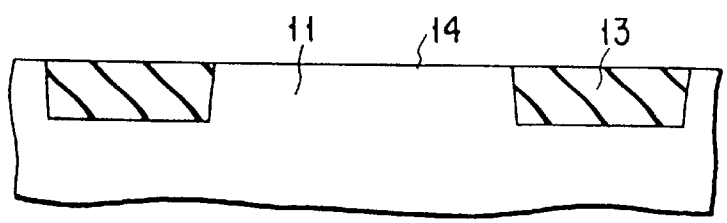
FIG. 3 is a sectional view of the semiconductor structure in a step of a process of fabrication according to an embodiment of the present invention, taken in line III—III in FIG. 2.

Preferred embodiments of the invention will be described with reference to FIGS. 1 to 26.

FIG. 1 is a plan view showing a semiconductor memory device according to the invention. Specifically, a plurality of element regions 14 are defined by an element-isolating oxide film 13 on a semiconductor substrate 11. A plurality of word lines 19 corresponding to gate electrodes of a plurality of MOS transistors extend vertically, while a plurality of bit lines 33 extend laterally in FIG. 1. A plurality of storage capacitors 41 are formed in layers above the bit lines 33. Each of the bit lines and the source/drain regions of each of the MOS transistors are connected to each other by a plug 28. The storage capacitors 41 and the source/drains of the MOS transistors are connected to each other by third plugs (not shown) in the same layer as the plugs 28 and also by plugs 36 reaching the third plugs.

Now, a fabrication process of the invention will be described.

Figure 4:
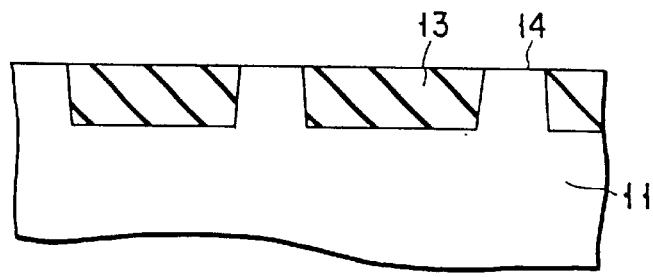
FIG. 4 is a sectional view of the semiconductor structure in a step of the process of fabrication according to the embodiment of the present invention, taken in line IV—IV in FIG. 2.

The element-isolating oxide film 13 is formed on the semiconductor substrate 11 using an element region pattern 12 of FIG. 2 by the STI (shallow trench isolation) technique, as shown in FIGS. 1, 3 and 4. Element regions 14 defined by the element-isolating oxide film 13 thus are formed. FIGS. 3 and 4 are sectional views of the semiconductor structure, taken in line III—III in FIG. 2 aligned with line IA—IA in FIG. 1 and line IV—IV in FIG. 2 aligned with line IC—IC in FIG. 1, respectively, when the element region pattern 12 shown in FIG. 2 is used.

Figure 5:
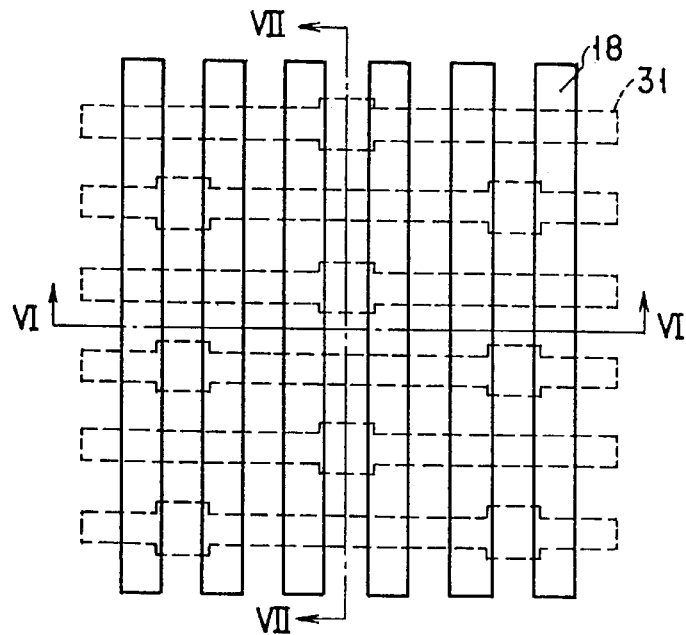
FIG. 5 is a plan view showing a gate electrode pattern used to fabricate the semiconductor memory device shown in FIG. 1.
Figure 6:
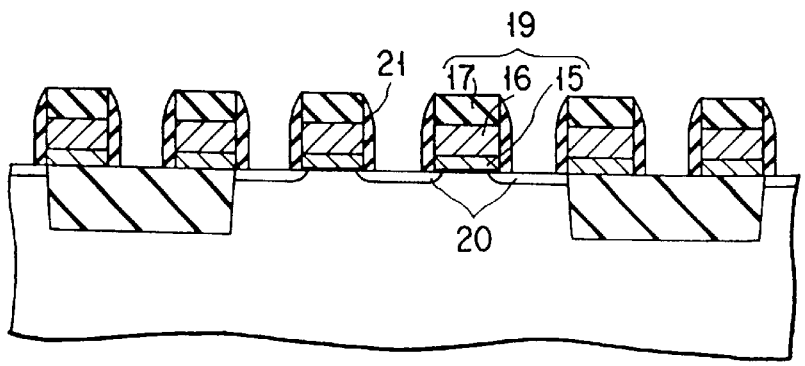
FIG. 6 is a sectional view of the semiconductor structure in a step of the process of fabrication according to the embodiment of the present invention, taken in line VI—VI in FIG. 5.

Then, a gate oxide film (not shown) of about 6 nm is formed on the element regions 14. A P-doped first polysilicon film 15 of about 50 nm, a tungsten silicide film 16 of about 100 nm and a first silicon nitride film 17 of about 100 nm are sequentially deposited. The first silicon nitride film 17, the tungsten silicide film 16 and the P-doped first polysilicon film 15 are patterned using a gate electrode pattern 18 shown in FIG. 5. Gate electrodes 19 of the MOSFETs thus are formed as shown in FIG. 6. Next, As is ion-implanted at about 20 keV and 5E13 $cm^{-2}$, for example, thereby forming source/drain diffusion regions 20 as shown in FIGS. 6 and 7. A second silicon nitride film of about 30 nm is deposited over the whole surface of the substrate, and etched back thereby to form sidewalls 21 of each gate electrode 19. FIGS. 6 and 7 correspond to FIGS. 3 and 4, respectively, and are sectional views of the semiconductor structure taken in lines VI—VI and VII—VII, respectively, in FIG. 5, when the gate electrode pattern 18 shown in FIG. 5 is used.

As the next step, a first BPSG film 22 of about 250 nm is deposited on the substrate 11, and with the first silicon nitride film 17 as a stopper, the surface is flattened using the CMP (chemical mechanical polishing) process. As shown in FIGS. 8 and 9, the first BPSG film 22 thus is formed flush with the first silicon nitride film 17. FIG. 8 corresponds to FIG. 6, and FIG. 9 corresponds to FIG. 7.

Next, photoresist masks 23 are formed, as shown in FIGS. 11 and 12, over the whole surface of the semiconductor substrate using a plug pattern 24 of FIG. 10. After that, the first BPSG film 22 is patterned in self-alignment on the gate electrodes by use of the selective RIE (reactive ion etching) process with an etching rate ratio of at least 20 between BPSG and SiN. FIGS. 11 and 12 correspond to FIGS. 8 and 9, respectively, and are sectional views of the semiconductor structure taken in lines XI—XI and XII—XII, respectively, in FIG. 10, when the plug pattern 24 shown in FIG. 10 is used.

As the next step, the photoresist masks 23 are removed, and a P-doped second polysilicon film 25 of about 250 nm is deposited over the whole surface of the semiconductor substrate. With the first silicon nitride film 17 and the first BPSG film 22 as a stopper, the surface is flattened using the CMP (chemical mechanical polishing) process. In this way, the second polysilicon film 25 thus is formed in the same plane as the first BPSG film 22 as shown in FIGS. 13 and 14. FIG. 13 corresponds to FIG. 11, and FIG. 14 corresponds to FIG. 12.

Figure 15:
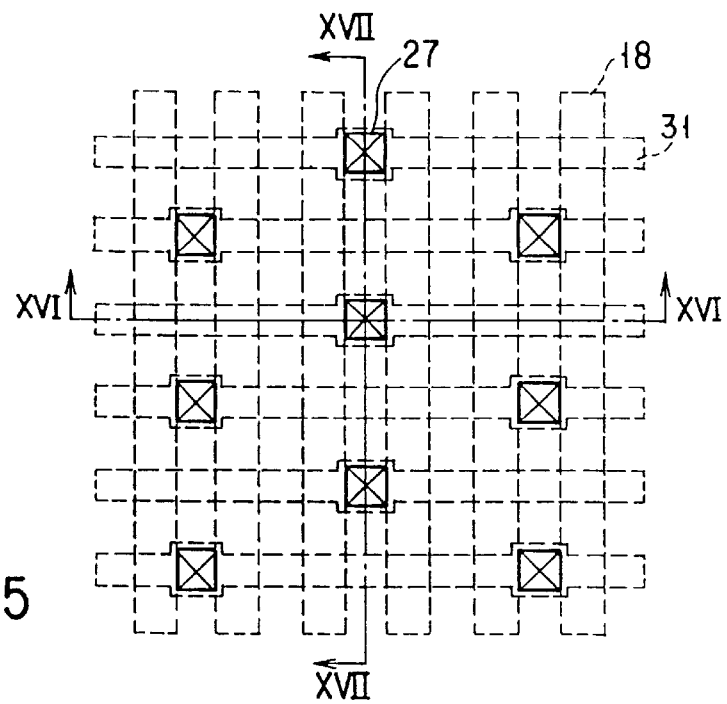
FIG. 15 is a plan view showing a bit line contact pattern used to fabricate the semiconductor memory device shown in FIG. 1.
Figure 16:
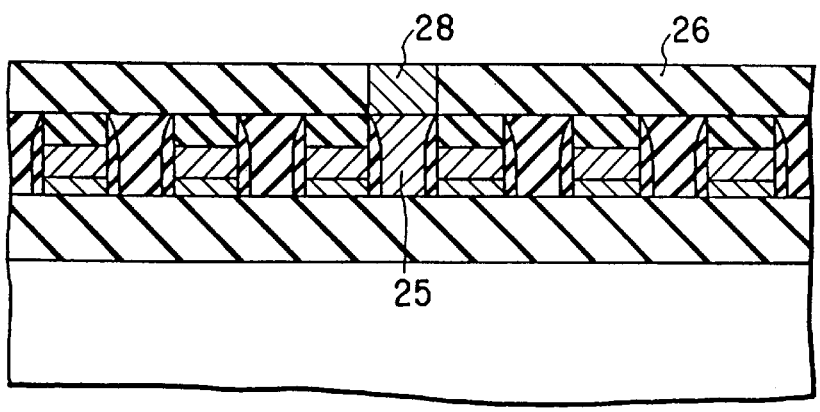
FIG. 16 is a sectional view of the semiconductor structure in a step of the process of fabrication according to the embodiment of the present invention, taken in line XVI—XVI in FIG. 15.
Figure 17:
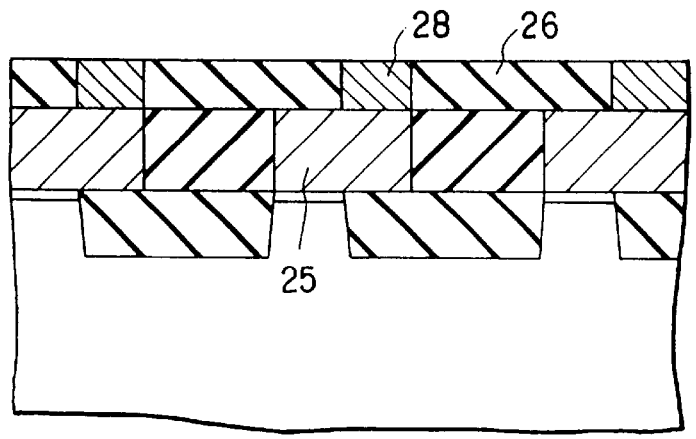
FIG. 17 is a sectional view of the semiconductor structure in a step of the process of fabrication according to the embodiment of the present invention, taken in line XVII—XVII in FIG. 15.

A second BPSG film 26 of about 150 nm is formed over the whole surface of the semiconductor substrate, followed by patterning the second BPSG film 26, as shown in FIGS. 16 and 17, using a bit line contact pattern 27 shown in FIG. 15. A first tungsten film 28 of about 200 nm is selectively grown, as shown in FIGS. 16 and 17, using the CVD process on the second polysilicon film 25 exposed to the opening of the second BPSG film 26 formed by the patterning process. With the second BPSG film 26 as a stopper, a first tungsten film 28 is flattened using the CMP process, so that the upper surface of the first tungsten film 28 is of the same height as, i.e., flush with the upper surface of the second BPSG film 26. FIGS. 16 and 17 are sectional views of the semiconductor structure taken in lines XVI—XVI and XVII—XVII, respectively, in FIG. 15, when the bit line contact pattern 15 shown in FIG. 15 is used. FIG. 17 corresponds to FIG. 14. However, FIG. 16 does not correspond to FIG. 13, and is a sectional view of a substrate portion displaced half the bit line pitch from the substrate portion shown in FIG. 13, since lines XVI—XVI are aligned with line IB—IB in FIG. 1 and, displaced half the bit line pitch from lines XI—XI in FIG. 10.

Figure 18:
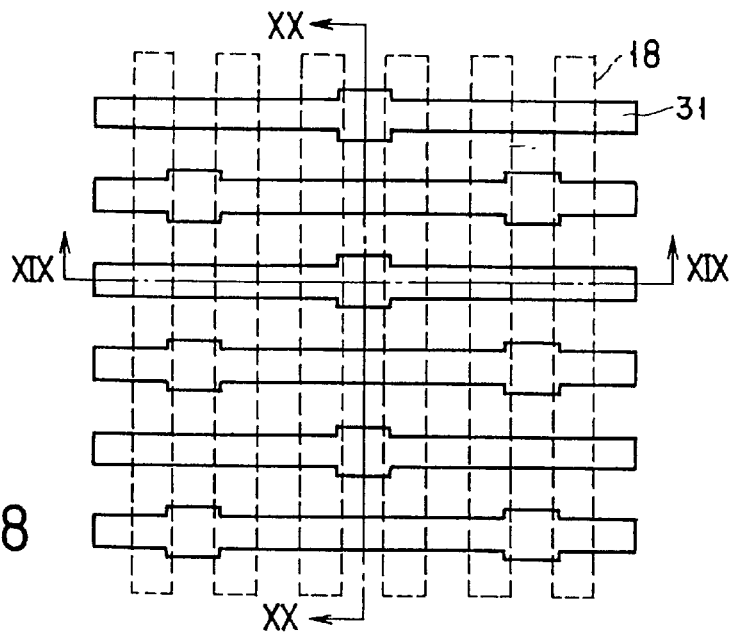
FIG. 18 is a plan view showing a bit line pattern used to fabricate the semiconductor memory device shown in FIG. 1.
Figure 19:
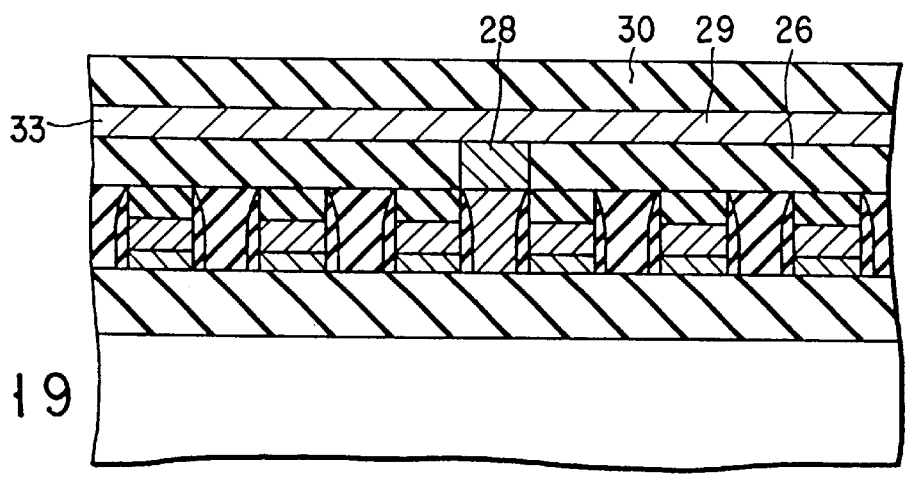
FIG. 19 is a sectional view of the semiconductor structure in a step of the process of fabrication according to the embodiment of the present invention, taken in line XIX—XIX in FIG. 18.
Figure 20:
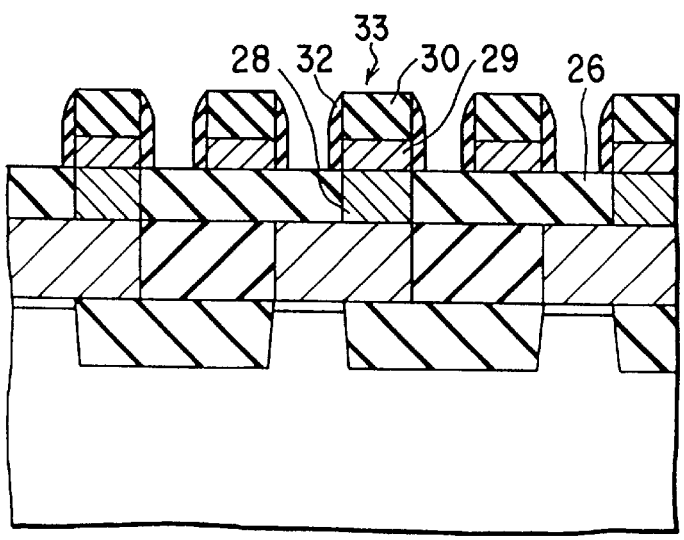
FIG. 20 is a sectional view of the semiconductor structure in a step of the process of fabrication according to the embodiment of the present invention, taken in line XX—XX in FIG. 18.

Then, a barrier metal (not shown) of about 20 nm, a second tungsten film 29 of about 100 nm and a third silicon nitride film 30 of about 150 nm are deposited sequentially over the whole surface of the semiconductor substrate. Using the bit line pattern 31 shown in FIG. 18, the third silicon nitride film 30, the second tungsten film 29 and the barrier metal are patterned, thereby forming bit lines 33 comprising the second tungsten film 29 as shown in FIGS. 19 and 20. Next, a fourth silicon nitride film 32 of about 30 nm is deposited over the whole surface, and using the etch back process, a side wall is formed on the sides of each bit line 33. FIGS. 19 and 20 correspond to FIGS. 16 and 17, respectively, and are sectional views of the semiconductor structure taken in lines XIX—XIX and XX—XX, respectively, in FIG. 18, when the bit line pattern 31 shown in FIG. 18 is used.

As the next step, a third BPSG film 34 of about 400 nm is deposited over the whole substrate surface. Using the CMP process, the third BPSG film 34 is flattened in such a manner that the thickness of the third BPSG film 34 is about 150 nm on the bit lines 33. The third BPSG film 34 and the second BPSG film 26 are patterned in self-alignment on the bit lines 33, as shown in FIGS. 22 and 23, using the storage node contact pattern 35 shown in FIG. 21 by means of the selective RIE (reactive ion etching) technique of BPSG/SiN etching rate ratio of at least 20. A third tungsten film 36 of about 550 nm is selectively grown, as shown in FIGS. 22 and 23, by the CVD process on the second polysilicon film 25 exposed to the openings of the third BPSG film 34 and the second BPSG film 26 formed by the patterning described above. Then, with the third BPSG film 34 as a stopper, the third tungsten film 36 and the third BPSG film 34 are flattened by the CMP process to such an extent that the uppermost surfaces thereof are flush with each other. FIGS. 22 and 23 are sectional views of the semiconductor structure taken in lines XXII—XXII and XXIII—XXIII, respectively, in FIG. 21, when the storage node contact pattern 35 shown in FIG. 21 is used. FIG. 23 corresponds to FIG. 20. However, FIG. 22 does not correspond to FIG. 19, and is a sectional view of a substrate portion displaced half the bit line pitch from the substrate portion shown in FIG. 19, since lines XXII—XXII are aligned with line IA—IA in FIG. 1, and displaced half the bit line pitch from lines XIX—XIX in FIG. 18.

Figure 26:
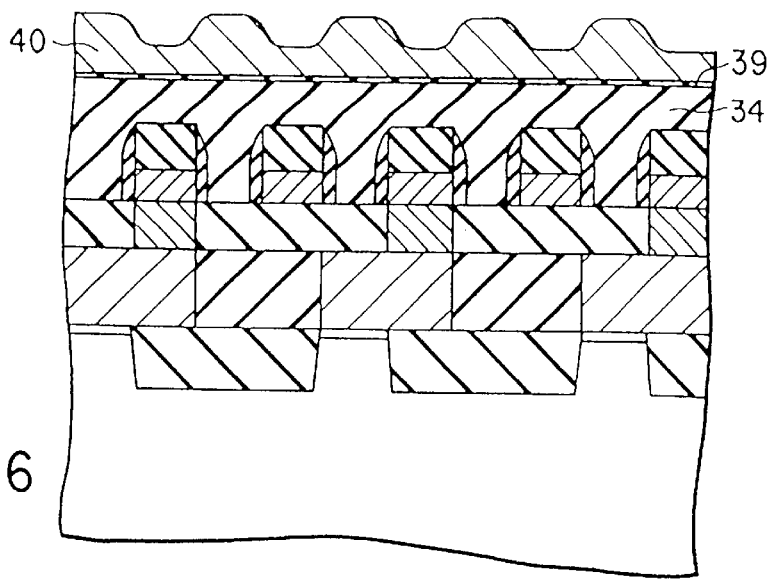
FIG. 26 is a sectional view of the semiconductor structure in a step of the process of fabrication according to the embodiment of the present invention, taken in line XXVI—XXVI in FIG. 24.
Figure 27:
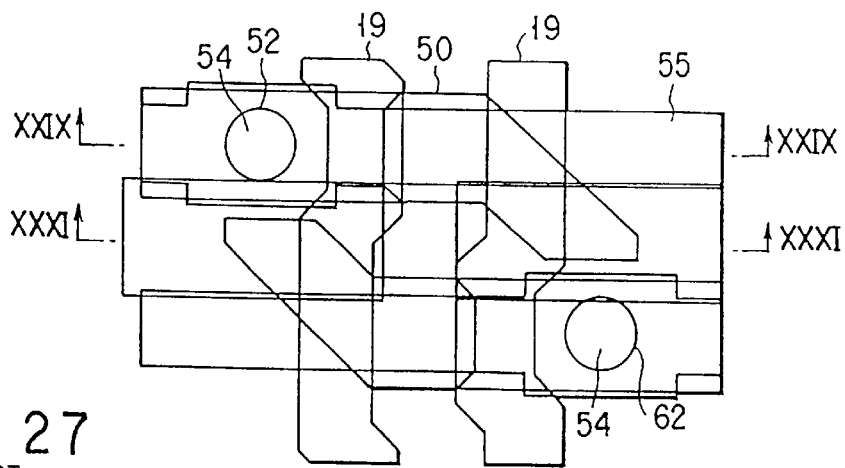
FIG. 27 is a plan view of a conventional COB cell.
Figure 28:
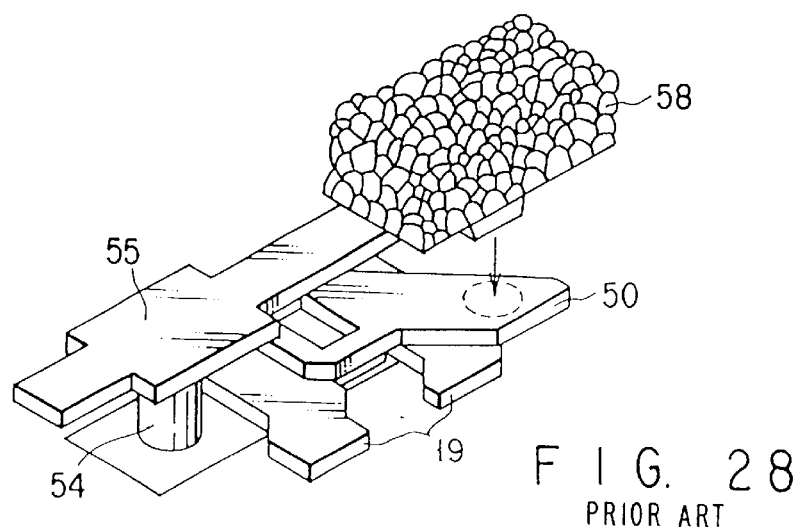
FIG. 28 is a perspective view of the conventional COB cell shown in FIG. 27.
Figure 29:
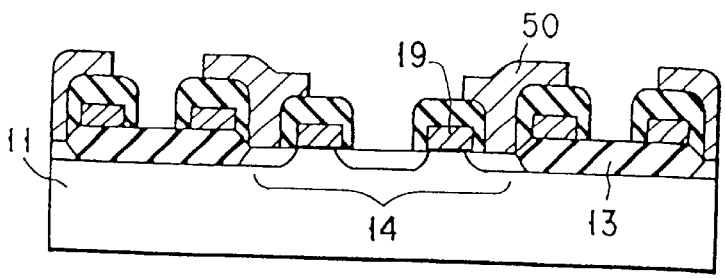
FIG. 29 is a sectional view of the conventional COB cell in a step of the process of fabrication, taken in line XXIX—XXIX in FIG. 27.
Figure 30:
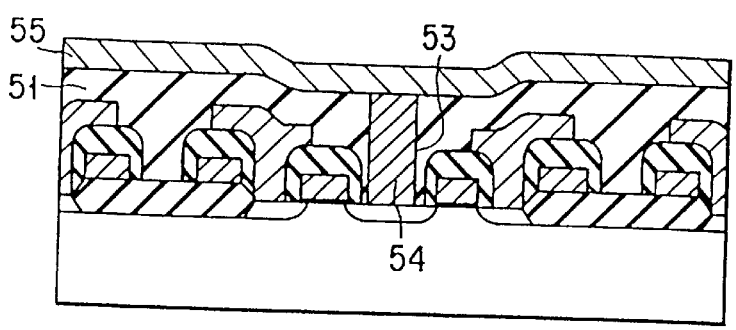
FIG. 30 is a sectional view of the conventional COB cell in a step of the process of fabrication, taken in line XXIX—XXIX in FIG. 27.
Figure 31:
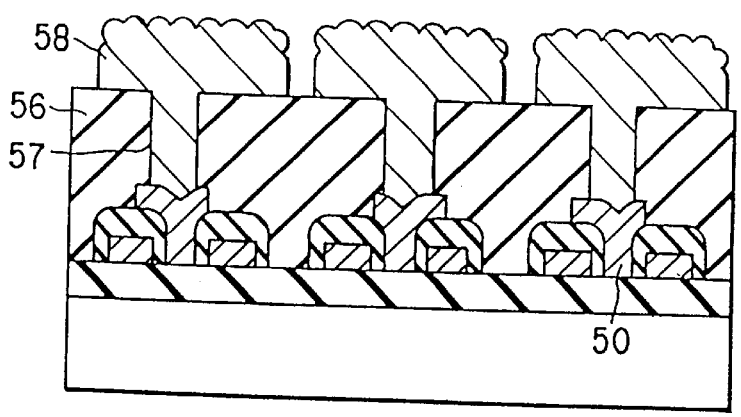
FIG. 31 is a sectional view of the conventional COB cell in a step of the process of fabrication, taken in line XXXI—XXXI in FIG. 27.
Figure 32:
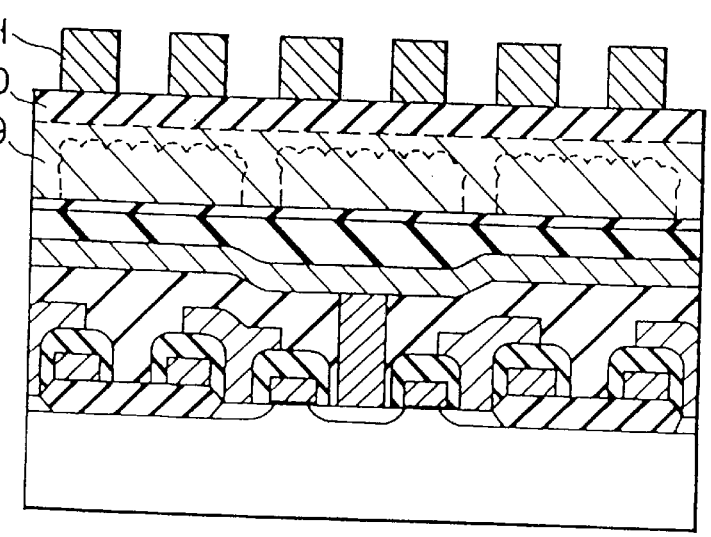
FIG. 32 is a sectional view of the conventional COB cell in a step of the process of fabrication, taken in line XXIX—XXIX in FIG. 27.

As the next step, a first tungsten nitride film 37 of about 200 nm is deposited over the whole substrate surface, and is patterned, as shown in FIG. 25, using the storage node pattern 38 shown in FIG. 24. Then, a $BaSrTiO_3$ film 39 of about 0.4 nm in terms of oxide film thickness and a second tungsten nitride film 40 of about 100 nm are sequentially deposited over the whole substrate surface, thereby completing a storage capacitor 41. FIGS. 25 and 26 correspond to FIGS. 22 and 23, respectively, and are sectional views of the semiconductor structure taken in lines XXV—XXV and XXVI—XXVI, respectively, when the storage pattern 38 shown in FIG. 24 is used.

Now, a second embodiment of the invention is described.

Figure 33:
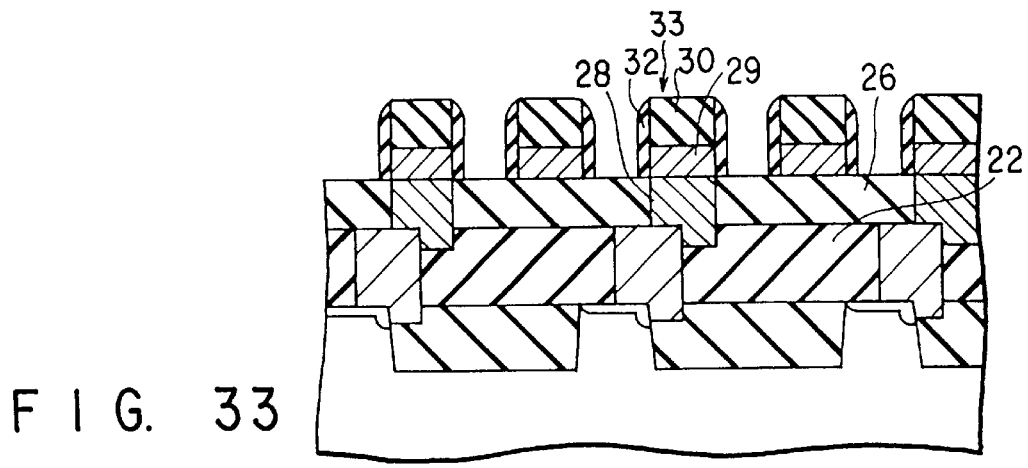
FIG. 33 is a sectional view of a semiconductor structure in a step of the process of fabrication according to another embodiment of the present invention, taken in line XXXIII—XXXIII in FIG. 34.
Figure 34:
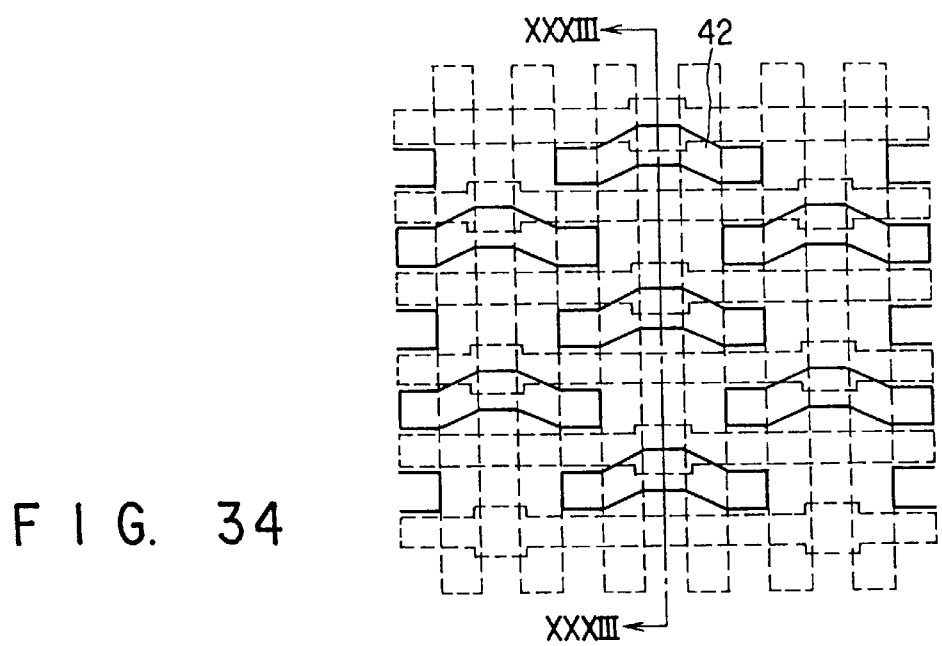
FIG. 34 is a plan view showing a plug pattern used to fabricate the semiconductor memory device shown in FIG. 33.

A sectional view of a semiconductor structure after forming bit lines according to the second embodiment is shown in FIG. 33. FIG. 33 corresponds to FIG. 20 showing the first embodiment of the invention, and is a sectional view taken in line XXXIII—XXXIII in FIG. 34, when a plug pattern 42 shown in FIG. 34 is used. In this structure, the plug pattern 42 of FIG. 34 is used in place of the plug pattern 24 of FIG. 10, so that the first BPSG film 22 is patterned in self-alignment on the gate electrodes. As a result, a polysilicon plug smaller than that according to the first embodiment can be formed, thereby reducing the bit line capacity. Also, in patterning contact holes, the STI element-isolating oxide film exposed to the opening is over-etched by, for example, about 50 nm. The polysilicon plug and the semiconductor substrate, therefore, are in contact with each other by way of the sides of the substrate as well as by way of the surface thereof. The contact resistance thus can be reduced even with a small plug. The other steps are identical to the corresponding ones of the first embodiment of the invention and will not be described.

Now, a third embodiment of the invention is described below.

Figure 35:
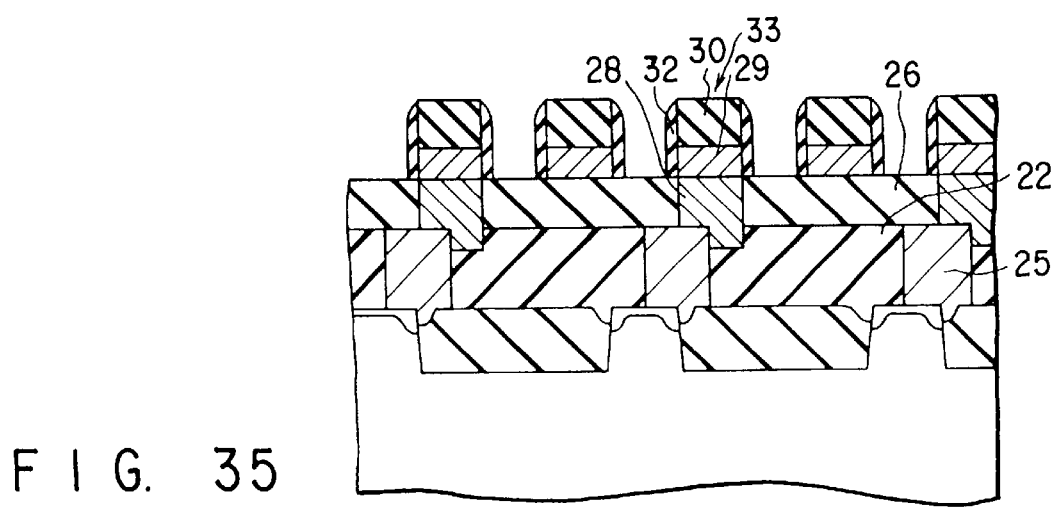
FIG. 35 is a sectional view of a semiconductor structure in a step of the process of fabrication according to a further embodiment of the present invention, taken in line XXXIII-XXXIII in FIG. 34.

A sectional view of the third embodiment after bit lines formation is shown in FIG. 35. This diagram corresponds to FIG. 20 according to the first embodiment of the invention, and is a sectional view taken in line XXXIII—XXXIII in FIG. 34 when the plug pattern 42 shown in FIG. 34 is used. A second polysilicon film 25 formed with a polysilicon plug is buried in part of the element-isolating oxide film at a position adjacent to an element region. This structure is obtained by forming this recess at the time of forming the STI and then using the plug pattern 42 shown in FIG. 34 instead of the plug pattern of FIG. 10. This recess can be formed without a special process at the time of forming the STI. The remaining process is identical to the corresponding one of the first embodiment and will not be described.

As described above, the application of the invention to a COB DRAM cell permits a polysilicon plug to be formed in self-alignment on the source and drain. A bit line contact and a storage electrode contact are formed on this polysilicon plug, whereby the aspect ratio of both the bit line contact and the storage electrode contact can be reduced.

Further, a polysilicon according to the invention is formed in self-alignment on the gate electrode, and therefore is free of shorting with the contact on an adjacent element region. Also, the plugs of the source and drain never short with each other. The polysilicon according to the invention therefore is considered highly resistant to misregistration.

Furthermore, the formation of a polysilicon plug according to the invention requires no independent lithography step, resulting in a reduced number of fabrication steps.

Also, the use of the second and third embodiments can shorten the polysilicon plug connecting the bit lines and the element regions. The bit line capacity thus can be reduced by the corresponding amount. Further, since the polysilicon plug and the semi-conductor substrate are in contact with each other by way of the substrate surface, the contact resistance can be reduced.

In addition, according to the third embodiment, a polysilicon plug is buried only in the interface with an element region at the lower part of the contact but not in the element-isolating region. The third embodiment, therefore, can further reduce the bit line capacity as compared with the second embodiment.

According to the invention, there is provided a structure of a memory cell and a fabrication method thereof, in which the aspect ratio of the capacitor contact and the bit line contact can be reduced in forming a COB DRAM cell, and which is substantially free of the effect of a misregistration, while at the same time eliminating the need of increasing the number of fabrication steps.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
    an element-isolating film formed in a surface of a semiconductor substrate to define an element region;
    a transistor formed in said element region, and having a gate electrode and source and drain regions, said gate electrode including a gate conductive layer and a gate protecting film formed over said gate conductive layer;
    a first interlayer insulating film formed on said element-isolating film;
    a first contact hole formed in said first interlayer insulating film, and opening to one of said source and drain regions and a portion of said element-isolating film, a side of the first contact hole being adjacent to said gate electrode of said transistor;
    a first conductive film formed in said first contact hole, contacting said one of said source and drain regions and said portion of said element-isolating film, the first conductive film being adjacent to said gate electrode of said transistor;
    a second interlayer insulating film formed on said first interlayer insulating film, said gate electrode, and said first conductive film, a material of said gate protecting film being different from a material of said second interlayer insulating film;
    a bit line contact hole formed in said second interlayer insulating film, the bit line contact hole opening to a portion of said first conductive film above said element-isolating film; and
    a bit line layer formed on said second interlayer insulating film, and electrically connected to said portion of said first conductive film through said bit line contact hole.

2. A semiconductor memory device according to claim 1, wherein said gate electrode is formed on said element region and extends onto said element-isolating film.

3. A semiconductor memory device according to claim 1, wherein said first conductive film comprises polysilicon.

4. A semiconductor memory device according to claim 1, further comprising:
    a second conductive film contacting the other of said source and drain regions through a second contact hole formed in said first interlayer insulating film.

5. A semiconductor memory device according to claim 4, wherein said second conductive film comprises polysilicon.

6. A semiconductor memory device according to claim 4, further comprising:
    a third interlayer insulating film formed on said second interlayer insulating film and said bit line layer;
    a third contact hole formed in said second and third interlayer insulating films and opening to said second conductive film; and
    an electrode layer formed on said third interlayer insulating film, contacting said second conductive film through said third contact hole.

7. A semiconductor memory device according to claim 6, further comprising:
    a capacitor insulating film formed on said electrode layer; and
    a plate electrode layer formed on said capacitor insulating film.

8. A semiconductor memory device according to claim 1, wherein said gate electrode further comprises a gate insulating film formed on said element region, said gate conductive layer extending over said gate insulating film, said gate protecting film including a protective film formed on an upper surface of said gate conductive layer and a protective film formed on a side surface of said gate conductive layer.

9. A semiconductor memory device according to claim 1, wherein said element-isolating film comprises an oxide film provided in a shallow trench formed in said semiconductor substrate.

10. A semiconductor memory device according to claim 1, wherein an upper surface of said first conductive film, an upper surface of said gate electrode and an upper surface of said first interlayer insulating film are coplanar.

11. A semiconductor memory device according to claim 1, wherein said gate protecting film further includes portions formed on the side walls of said gate conductive layer.

12. A semiconductor memory device comprising:
    an element-isolating film formed in a surface of a semiconductor substrate to define an element region;
    a transistor formed in said element region and having a gate electrode and source and drain regions, said gate electrode including a gate conductive layer and a gate protecting film formed over said gate conductive layer;
    a first interlayer insulating film formed on said element-isolating film;
    a first contact hole formed in said first interlayer insulating film, and formed on one of said source and drain regions of said transistor and a portion of said element-isolating film, a side of the first contact hole being adjacent to said gate electrode of said transistor,
    a first conductive film formed in said first contact hole, contacting said one of said source and drain regions of said transistor and said portion of said element-isolating film, the first conductive film being adjacent to said gate electrode of said transistor;
    a second contact hole formed in said first interlayer insulating film, and formed on the other of said source and drain regions of said transistor, a side of the second contact hole being adjacent to said gate electrode of said transistor;

a second conductive film formed in said second contact hole, contacting said other of said source and drain regions of said transistor, the second conductive film being adjacent to said gate electrode of said transistor;

a second interlayer insulating film formed on said first interlayer insulating film, said first and second conductive films, and said gate electrode of said transistor, a material of said gate protecting film being different from a material of said second interlayer insulating film;

a bit line contact hole formed in said second interlayer insulating film, the bit line contact hole opening to a portion of said first conductive film above said element-isolating film;

a bit line formed on said second interlayer insulating film, and electrically connected to said first conductive film through said bit line contact hole;

a third interlayer insulating film formed on said bit line and said second interlayer insulating film;

a storage node contact hole formed in said third interlayer insulating film and said second interlayer insulating film, and opening to said second conductive film; and a capacitive element formed on said third interlayer insulating film and electrically connected to said second conductive film through said storage node contact hole.

13. A semiconductor memory device according to claim 12, wherein said gate electrode is formed on said element region and extends onto said element-isolating film.

14. A semiconductor memory device according to claim 12, wherein said capacitive element comprises a storage node electrode, a capacitor insulating film and a plate electrode sequentially formed on said third interlayer insulating film, said storage node electrode contacting said second conductive film through said storage node contact hole.

15. A semiconductor memory device according to claim 12, wherein said gate electrode further comprises a gate insulating film formed on said element region, said gate conductive layer extending over said gate insulating film, said gate protecting film including a protective film formed on an upper surface of said gate conductive layer and a protective film formed on a side surface of said gate conductive layer.

16. A semiconductor memory device according to claim 12, wherein said element-isolating film comprises an oxide film provided in a shallow trench formed in said semiconductor substrate.

17. A semiconductor memory device according to claim 12, wherein said first conductive film comprises polysilicon.

18. A semiconductor memory device according to claim 12, wherein an upper surface of said gate electrode of said transistor, upper surfaces of said first and second conductive films and an upper surface of said first interlayer insulating film are coplanar.

19. A semiconductor memory device according to claim 12, wherein said gate protecting film further includes portions formed on the side walls of said gate conductive layer.

20. A semiconductor memory device comprising:

an element-isolating film formed in a surface of a semiconductor substrate to define an element region;

a transistor formed in said element region and having a gate electrode and source and drain regions, said gate electrode including a gate conductive layer and a gate protecting film formed over said gate conductive layer;

a first interlayer insulating film formed on said element-isolating film;

a first contact hole formed in said first interlayer insulating film, and formed on one of said source and drain regions of said transistor and a portion of said element-isolating film;

a first conductive film formed in said first contact hole, contacting said one of said source and drain regions of said transistor and said portion of said element-isolating film;

a second contact hole formed in said first interlayer insulating film and formed on the other of said source and drain regions of said transistor, a side of the second contact hole being adjacent to said gate electrode of said transistor;

a second conductive film formed in said second contact hole, contacting said other of said source and drain regions of said transistor, the second conductive film being adjacent to said gate electrode of said transistor;

a second interlayer insulating film formed on said first interlayer insulating film, said first and second conductive films, and said gate electrode of said transistor, a material of said gate protecting film being different from a material of said second interlayer insulating film;

a bit line contact hole formed in said second interlayer insulating film, the bit line contact hole opening to a portion of said first conductive film above said element-isolating film;

a bit line formed on said second interlayer insulating film, and electrically connected to said first conductive film through said bit line contact hole;

a third interlayer insulating film formed on said bit line and said second interlayer insulating film;

a storage node contact hole formed in said third interlayer insulating film and said second interlayer insulating film, and opening to said second conductive film; and a capacitive element formed on said third interlayer insulating film and connected to said second conductive film through said storage node contact hole.

21. A semiconductor memory device according to claim 20, wherein said gate electrode is formed on said element region and extends onto said element-isolating film.

22. A semiconductor memory device according to claim 20, wherein said capacitive element comprises a storage node electrode, a capacitor insulating film and a plate electrode sequentially formed on said third interlayer insulating film, said storage node electrode contacting said second conductive film through said storage node contact hole.

23. A semiconductor memory device according to claim 20, wherein said gate electrode further comprises a gate insulating film formed on said element region, said gate conductive layer extending over said gate insulating film, said gate protecting film including a protective film formed on an upper surface of said gate conductive layer and a protective film formed on a side surface of said gate conductive layer.

24. A semiconductor memory device according to claim 20, wherein said element-isolating film comprises an oxide film provided in a shallow trench formed in said semiconductor substrate.

25. A semiconductor memory device according to claim 20, wherein said first conductive film comprises polysilicon.

26. A semiconductor memory device according to claim 20, wherein an upper surface of said gate electrode of said transistor, upper surfaces of said first and second conductive films and an upper surface of said first interlayer insulating film are coplanar.

27. A semiconductor memory device according to claim 20, wherein said gate protecting film further includes portions formed on the side walls of said gate conductive layer.

28. A semiconductor memory device comprising:
   a plurality of semiconductor elements arranged in a matrix formed on a semiconductor substrate, each of said semiconductor elements including:
   an element-isolating film formed in a surface of said semiconductor substrate to define an element region;
   a transistor formed in said element region and having a gate electrode extending in a row direction, and source and drain regions, said gate electrode including a gate conductive layer and a gate protecting film formed over said gate conductive layer;
   a first interlayer insulating film formed on said element-isolating film;
   a first contact hole formed in said first interlayer insulating film, and opening to one of said source and drain regions of said transistor and a portion of said element-isolating film;
   a first conductive film formed in said first contact hole, contacting said one of said source and drain regions and said portion of said element-isolating film;
   a second interlayer insulating film formed on said first interlayer insulating film, said gate electrode, and said first conductive film, a material of said gate protecting film being different from a material of said second interlayer insulating film;
   a bit line contact hole formed in said second interlayer insulating film, the bit line contact hole opening to a portion of said first conductive film above said element-isolating film; and
   a bit line plug formed on said second interlayer insulating film and electrically connected to said portion of said first conductive film through said bit line contact hole, in which said semiconductor elements further include a plurality of bit line layers extending in a column direction each contacting said bit line plugs which are in a corresponding column.

29. A semiconductor memory device according to claim 28, wherein a side of the first contact hole is adjacent to said gate electrode of said transistor, and the first conductive film is adjacent to said gate electrode of said transistor.

30. A semiconductor memory device according to claim 28, wherein said first conductive film comprises polysilicon.

31. A semiconductor memory device according to claim 28, further comprising:
   a second contact hole formed on the other of said source and drain regions of said transistor;
   a second conductive film formed in said second contact hole, contacting said other of said source and drain regions of said transistor;
   a third interlayer insulating film formed on said bit line and said second interlayer insulating film;
   a storage node contact hole formed in said third interlayer insulating film and said second interlayer insulating film, and opening to said second conductive film; and
   a capacitive element formed on said third interlayer insulating film and connected to said second conductive film through said storage node contact hole.

32. A semiconductor memory device according to claim 31, wherein said second conductive film comprises polysilicon.

33. A semiconductor memory device according to claim 31, wherein a side of the second contact hole is adjacent to said gate electrode of said transistor, and the second conductive film is adjacent to said gate electrode of said transistor.

34. A semiconductor memory device according to claim 28, wherein an upper surface of said gate electrode of said transistor, upper surfaces of said first and second conductive films and an upper surface of said first interlayer insulating film are coplanar.

35. A semiconductor memory device according to claim 28, wherein said capacitive element comprises a storage node electrode, a capacitor insulating film and a plate electrode sequentially formed on said third interlayer insulating film, said storage node electrode contacting said second conductive film through said storage node contact hole.

36. A semiconductor memory device according to claim 28, wherein said gate electrode further comprises a gate insulating film formed on said element region, said gate conductive layer extending over said gate insulating film, said gate protecting film including a protective film formed on an upper surface of said gate conductive layer and a protective film formed on a side surface of said gate conductive layer.

37. A semiconductor memory device according to claim 28, wherein said element-isolating film comprises an oxide film provided in a shallow trench formed in said semiconductor substrate.

38. A semiconductor memory device according to claim 28, wherein a side of the first contact hole is adjacent to said gate electrode of said transistor, the first conductive film is adjacent to said gate electrode of said transistor, a side of the second contact hole is adjacent to said gate electrode of said transistor, and the second conductive film is adjacent to said gate electrode of said transistor.

39. A semiconductor memory device according to claim 28, wherein said gate protecting film further includes portions formed on the side walls of said gate conductive layer.

40. A semiconductor memory device comprising:
   an element-isolating film formed in a surface of a semiconductor substrate to define an element region;
   a transistor formed in said element region, and having a gate electrode and source and drain regions, said gate electrode including a gate conductive layer and a gate protecting film formed over said gate conductive layer;
   a first interlayer insulating film formed on said element-isolating film;
   a first contact hole formed in said first interlayer insulating film, and opening to one of said source and drain regions and a portion of said element-isolating film, a side of the first contact hole being adjacent to said gate electrode of said transistor;
   a first conductive film formed in said first contact hole, contacting said one of said source and drain regions and said portion of said element-isolating film, the first conductive film being adjacent to said gate electrode of said transistor;
   a second interlayer insulating film formed on said first interlayer insulating film, said gate electrode, and said first conductive film, a material of said gate protecting film being different from a material of said second interlayer insulating film;
   a bit line contact hole formed in said second interlayer insulating film, the bit line contact hole opening to a portion of said first conductive film above said element-isolating film;

a bit line layer formed on said second interlayer insulating film, and electrically connected to said portion of said first conductive film through said bit line contact hole;

a bit line layer protecting film formed over said bit line layer; and a third interlayer insulating film formed on said bit line layer and second interlayer insulating film, a material of said bit line layer protecting film being different from a material of said third interlayer insulating film.

41. A semiconductor memory device comprising:

an element-isolating film formed in a surface of a semiconductor substrate to define an element region;

a transistor formed in said element region and having a gate electrode and source and drain regions, said gate electrode including a gate conductive layer and a gate protecting film formed over said gate conductive layer;

a first interlayer insulating film formed on said element-isolating film;

a first contact hole formed in said first interlayer insulating film, and formed on one of said source and drain regions of said transistor and a portion of said element-isolating film, a side of the first contact hole being adjacent to said gate electrode of said transistor, a first conductive film formed in said first contact hole, contacting said one of said source and drain regions of said transistor and said portion of said element-isolating film, the first conductive film being adjacent to said gate electrode of said transistor;

a second contact hole formed in said first interlayer insulating film, and formed on the other of said source and drain regions of said transistor, a side of the second contact hole being adjacent to said gate electrode of said transistor;

a second conductive film formed in said second contact hole, contacting said other of said source and drain regions of said transistor, the second conductive film being adjacent to said gate electrode of said transistor;

a second interlayer insulating film formed on said first interlayer insulating film, said first and second conductive films, and said gate electrode of said transistor, a material of said gate protecting film being different from a material of said second interlayer insulating film;

a bit line contact hole formed in said second interlayer insulating film, the bit line contact hole opening to a portion of said first conductive film above said element-isolating film;

a bit line formed on said second interlayer insulating film, and electrically connected to said first conductive film through said bit line contact hole;

a bit line protecting film formed over said bit line;

a third interlayer insulating film formed on said bit line and said second interlayer insulating film, a material of said bit line protecting film being different from a material of said third interlayer insulating film;

a storage node contact hole formed in said third interlayer insulating film and said second interlayer insulating film, and opening to said second conductive film; and a capacitive element formed on said third interlayer insulating film and electrically connected to said second conductive film through said storage node contact hole.

42. A semiconductor memory device comprising:

an element-isolating film formed in a surface of a semiconductor substrate to define an element region;

a transistor formed in said element region and having a gate electrode and source and drain regions, said gate electrode including a gate conductive layer and a gate protecting film formed over said gate conductive layer;

a first interlayer insulating film formed on said element-isolating film;

a first contact hole formed in said first interlayer insulating film, and formed on one of said source and drain regions of said transistor and a portion of said element-isolating film;

a first conductive film formed in said first contact hole, contacting said one of said source and drain regions of said transistor and said portion of said element-isolating film;

a second contact hole formed in said first interlayer insulating film and formed on the other of said source and drain regions of said transistor, a side of the second contact hole being adjacent to said gate electrode of said transistor;

a second conductive film formed in said second contact hole, contacting said other of said source and drain regions of said transistor, the second conductive film being adjacent to said gate electrode of said transistor;

a second interlayer insulating film formed on said first interlayer insulating film, said first and second conductive films, and said gate electrode of said transistor, a material of said gate protecting film being different from a material of said second interlayer insulating film;

a bit line contact hole formed in said second interlayer insulating film, the bit line contact hole opening to a portion of said first conductive film above said element-isolating film;

a bit line formed on said second interlayer insulating film, and electrically connected to said first conductive film through said bit line contact hole;

a bit line protecting film formed over said bit line;

a third interlayer insulating film formed on said bit line and said second interlayer insulating film, a material of said bit line protecting film being different from a material of said third interlayer insulating film;

a storage node contact hole formed in said third interlayer insulating film and said second interlayer insulating film, and opening to said second conductive film; and a capacitive element formed on said third interlayer insulating film and connected to said second conductive film through said storage node contact hole.

43. A semiconductor memory device comprising:

a plurality of semiconductor elements arranged in a matrix formed on a semiconductor substrate, each of said semiconductor elements including:

an element-isolating film formed in a surface of said semiconductor substrate to define an element region;

a transistor formed in said element region and having a gate electrode extending in a row direction and source and drain regions, said gate electrode including a gate conductive layer and a gate protecting film formed over said gate conductive layer;

a first interlayer insulating film formed on said element-isolating film;

a first contact hole formed in said first interlayer insulating film, and opening to one of said source and drain regions of said transistor and a portion of said element-isolating film;

a first conductive film formed in said first contact hole, contacting said one of said source and drain regions and said portion of said element-isolating film;

a second interlayer insulating film formed on said first interlayer insulating film, said gate electrode, and said first conductive film, a material of said gate protecting film being different from a material of said second interlayer insulating film;

a bit line contact hole formed in said second interlayer insulating film, the bit line contact hole opening to a portion of said first conductive film above said element-isolating film;

a bit line plug formed on said second interlayer insulating film and electrically connected to said portion of said first conductive film through said bit line contact hole, in which said semiconductor elements further include a plurality of bit line layers extending in a column direction each contacting said bit line plugs which are in a corresponding column;

a bit line layer protecting film formed over said bit line layers; and a third interlayer insulating film formed on said bit line layers and said second interlayer insulating film, a material of said bit line layer protecting film being different from a material of said third interlayer insulating film.

* * * * *